(12) United States Patent
Darges (10) Patent No.: US 8,373,520 B2
(45) Date of Patent: Feb. 12, 2013

(54) POWER COUPLER FOR INDUSTRIAL HIGH-FREQUENCY GENERATOR

(75) Inventor: Bernard Darges, Thonon les Bains (FR)

(73) Assignee: Thales, Neuilly sur Seine (FR)

( * ) Notice: Subject to any disclaimer, the term of this patent is extended or adjusted under 35 U.S.C. 154(b) by 255 days.

(21) Appl. No.: 12/671,863

(22) PCT Filed: Jul. 16, 2008

(86) PCT No.: PCT/EP2008/059338
§ 371 (c)(1),
(2), (4) Date: Apr. 14, 2010

(87) PCT Pub. No.: WO2009/016036
PCT Pub. Date: Feb. 5, 2009

(65) Prior Publication Data
US 2011/0234334 A1  Sep. 29, 2011

(30) Foreign Application Priority Data

Aug. 2, 2007  (FR) ..................................... 07 05669

(51) Int. Cl.
*H03H 7/38* (2006.01)
*H03H 7/46* (2006.01)
(52) U.S. Cl. ......... 333/124; 333/126; 333/129; 333/132
(58) Field of Classification Search .......... 333/124–129, 333/132
See application file for complete search history.

(56) References Cited

U.S. PATENT DOCUMENTS

| | | | |
|---|---|---|---|
| 3,480,881 A | 11/1969 | Boykin | |
| 5,218,317 A * | 6/1993 | Boulzaguet et al. | ...... 330/124 R |
| 7,046,088 B2 | 5/2006 | Ziegler | |

FOREIGN PATENT DOCUMENTS

| | | |
|---|---|---|
| JP | 2-189886 A | 7/1990 |
| WO | 03/077414 A2 | 9/2003 |

* cited by examiner

*Primary Examiner* — Robert Pascal
*Assistant Examiner* — Kimberly Glenn
(74) *Attorney, Agent, or Firm* — Baker & Hostetler LLP (57) ABSTRACT

The invention relates to a device for coupling individual high-frequency amplifiers (M1, M2, ... Mn) operating at a frequency f, including n high-frequency inputs E1, E2, ... Ei, ... Ep, ... En, n being an integer greater than 1, i and p being two integers between 1 and n, p being different from i, and a power high-frequency output (S) to supply a load (R) with a power which is the sum of the powers supplied by all the individual amplifiers connected via their power outputs to said high-frequency inputs. The coupling device includes n inductors L1, L2, Li, ... Lp, ... Ln connected by one of their ends to a respective high-frequency input, their other ends being connected together to one end (B) of an output capacitor (Cs) the other end of which is connected to the high-frequency output (S) in order to form as many series resonant LC circuits, resonating at the operating frequency f, between the inputs E1, E2, ... Ei, ... Ep, ... En and the high-frequency output (S), as there are amplifiers to be coupled.

12 Claims, 9 Drawing Sheets

POWER COUPLER FOR INDUSTRIAL HIGH-FREQUENCY GENERATOR

CROSS-REFERENCE TO RELATED APPLICATIONS

This application is a National Stage of International patent application PCT/EP2008/059338, filed on Jul. 16, 2008, which claims priority to foreign French patent application No. FR 07 05669, filed on Aug. 2, 2007, the disclosures of which are hereby incorporated by reference in their entirety.

FIELD OF THE INVENTION

The invention relates to a coupling device for solid-state industrial high-frequency (IHF) generators. These generators can be used notably in electromagnetic induction, dielectric loss or plasma heating devices.

BACKGROUND OF THE INVENTION

Electromagnetic induction heating involves causing a conductive part to heat up through the circulation of currents induced by a magnetic field. This means makes it possible to heat the part as a whole without direct contact with the energy source. The part to be heated (or induced) is surrounded by at least one current circulation loop (or inductor).

The working frequencies of the generator are between a few tens of kilohertz and a few megahertz. The powers needed vary between a few kilowatts and more than a megawatt. Electromagnetic induction heating is widely used in industry and in the scientific field. In industry, it is used notably in metallurgy to refine metals, to heat treat metal parts or to produce seam-welded pipes.

Dielectric loss heating involves causing an insulating part to be heated up by provoking losses in its mass, from an alternating electrical field. The part to be heated is a mediocre insulator. It is placed between two conductive plates powered by an alternating source. A capacitor is created, the dielectric of which is the part to be heated. The generators used generally have higher working frequencies than those of electromagnetic induction heating generators. They can be between a few tens of megahertz and a few gigahertz. This heating method is used in the timber industry for drying or bonding, in the textile industry or in the manufacture or forming of plastics.

Plasma heating consists in ionizing a gaseous medium to convert it into plasma. The kinetic energy of the electrons is converted into heat. A considerable temperature rise occurs. The part to be heated is placed in the plasma. The conversion of the gaseous medium into plasma is obtained by emission from an antenna. The working frequencies of the generator are between 1 megahertz and a few tens of megahertz. The heating method is used in many industrial applications such as the fusion of refractory products, chemical synthesis, etc.

Tube power stages are used to supply the high powers needed for industrial heating, but the advances made in the field of power transistors are more and more leading to the tubes being replaced with solid-state power stages that are more flexible to use.

Figure 1:
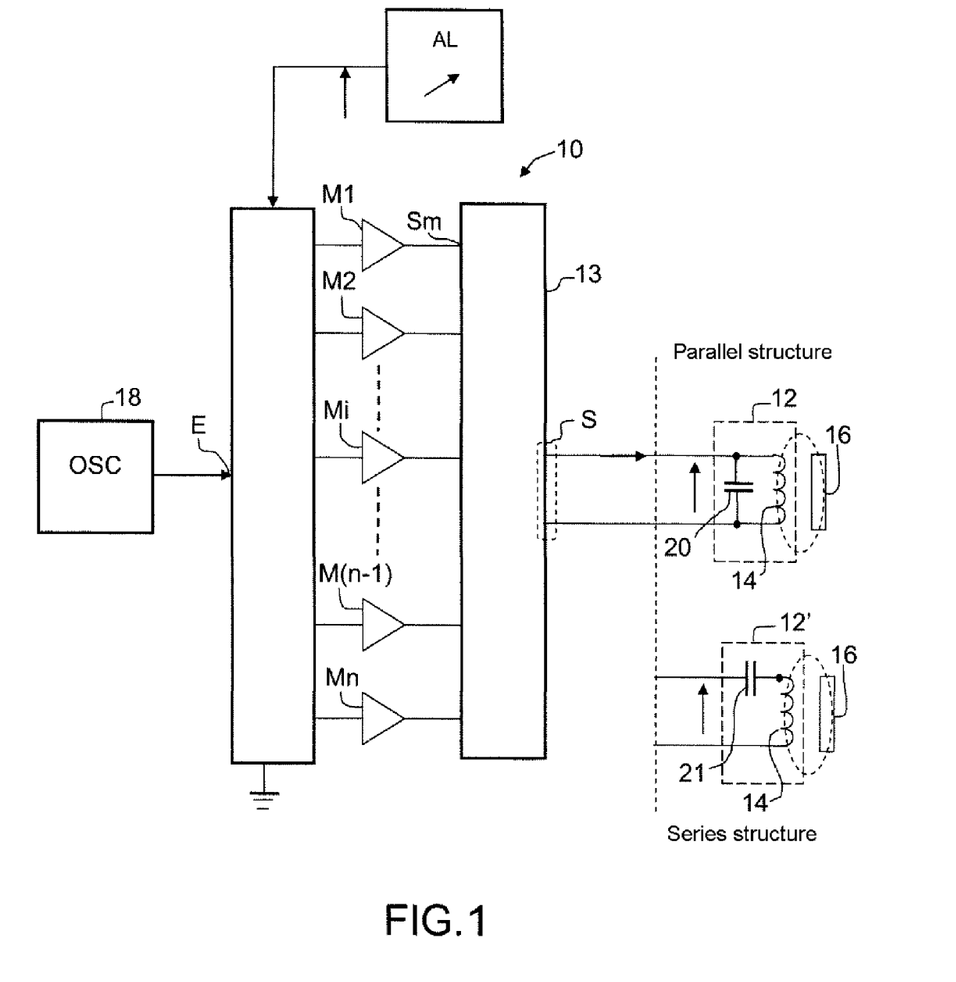
FIG. 1, already described, represents a schematic diagram of an industrial high-frequency generator of the prior art.

FIG. 1 represents a schematic diagram of an industrial high-frequency generator of the prior art including a solid-state power high-frequency amplifier 10 connected, by its power output S, to a resonant circuit 12, 12' (amplifier load).

The power stage 10 connected to the resonant circuit 12, 12' includes a plurality of molds M1, M2, . . . . Mi, . . . Mn with transistors coupled to the outputs of the modules by a coupling system 13 to supply the necessary high-frequency power.

The resonant circuit, with a parallel structure 12, or a series structure 12', includes an inductor 14 to heat a part 16. An oscillator 18 (OSC) supplies a high-frequency signal, with a frequency f, to an input E of the power amplifier 10.

In the example of FIG. 1, the heating of the part 16 is produced by induction. The inductor 14 is a coil 14 coupled to the part 16. A tuning capacitor 20, 21 in parallel, or in series, depending on the structure, with the coil 14 produces the resonant circuit 12, 12' with the induction frequency.

To obtain high HF powers (from a few kW to a few MW), the aggregation of individual transistorized RF modules M1, M2, . . . . Mi, . . . Mn, each supplying a portion of the total power as output of the heating generator, becomes the only solution in solid-state emitters.

These individual transistorized modules are voltage generators and placing voltage generators in parallel poses significant coupling problems. In practice, the voltage generators must be coupled in series (Thèvenin's principle), and the current generators have to be coupled in parallel (Norton's principle). The slightest voltage or phase offset of the voltage generators coupled in parallel would instantaneously generate very high currents in the individual modules because of their low impedance, which would immediately cause their destruction.

The parallel coupling of the individual modules, voltage generators, is all the more difficult to implement because they supply square signals. In practice, the transistors of the module operate in a block/saturated regime in order to improve their efficiency.

To avoid this parallel coupling problem because of the dispersion in the voltages at the output of the individual modules, there are known solutions.

The first solution is parallel coupling by 3 dB line coupler. This includes a load resistor referenced to ground. When an imbalance occurs between one channel and another (in phase or (and) in amplitude), the difference will be absorbed by this load, called a "bucket load". However, the size of this type of coupler, in λ/4, is too great given the relatively low operating frequencies of the IHF emitters.

The second solution is the so-called "Wilkinson" coupler. The latter includes a floating load resistor. When an imbalance occurs between one channel and another (in phase or/and in amplitude), the difference will be absorbed by this floating load.

These two types of couplers mentioned above are widely used in the RF field for frequencies greater than 30 MHz.

The third solution is the ferrite coupler equipped with an imbalance load (or bucket load) which is a hybrid of the Wilkinson coupler. This type of coupler is used in the RF field for frequencies greater than 2 MHz.

The fourth solution is a Wheatstone bridge coupler. The latter is equipped with an imbalance load. When an imbalance occurs between one channel and other (in phase or/and in amplitude), the difference will be absorbed by this imbalance load. This type of coupler is used in the RF field for frequencies below 2 MHz, for example, to couple high-power long-wave and medium wave emitters (100 kW to 1 MW).

However, these types of couplers mentioned, in addition to the cost and implementation problems, dissipate energy as pure loss in the imbalance loads or bucket loads, an energy dissipation that is associated with the output voltage differences between the coupled individual modules. This energy dissipation leads to a lowering of the efficiency of the heating generator.

SUMMARY OF THE INVENTION

To alleviate the drawbacks in the devices for coupling individual modules of IHF emitters, the invention proposes a device for coupling individual high-frequency amplifiers operating at a frequency f, including n high-frequency inputs E1, E2, . . . Ei, . . . Ep, . . . En, n being an integer greater than 1, i and p being two integers between 1 and n, p being different from i, and a power high-frequency output to supply a load with a power which is the sum of the powers supplied by all the individual amplifiers connected via their power outputs to said high-frequency inputs, characterized in that it includes n inductors L1, L2, Li, . . . Lp, . . . Ln connected via one of their ends to a respective high-frequency input E1, E2, . . . Ei, . . . Ep, . . . En, their other ends being connected together to one end of an output capacitor, the other end of which is connected to the high-frequency output in order to form as many series resonant LC circuits, resonating at the operating frequency f, between the inputs E1, E2, . . . Ei, . . . Ep, . . . En and the high-frequency output, as there are amplifiers to be coupled.

One main aim of the coupling device according to the invention is to couple without loss transistorized individual modules despite a dispersion in the output voltages of the individual modules, while ensuring their safety.

Another aim is to reduce the cost of the coupling device.

The invention also relates to an industrial high-frequency (IHF) generator including a plurality of high-frequency solid-state modules (M1, M2, . . . Mn), characterized in that the individual modules are coupled by their power outputs by a coupling device according to the invention.

BRIEF DESCRIPTION OF THE DRAWINGS

The invention will be better understood from exemplary embodiments, with reference to the indexed figures in which:

FIG. 8b shows the waveform and the amplitude of the voltages and currents in the coupler of FIG. 8a;

FIG. 9b shows the waveform and the amplitude of the voltages and currents in the coupler of FIG. 9a;

DETAILED DESCRIPTION OF EMBODIMENTS

The coupler according to the invention described hereinafter meets the following objectives:

coupling several transistorized individual modules to produce the power stage of the IHF generator. These solid-state individual modules are voltage generators which supply signals of rectangular waveform (of period T=1/f), which constitutes a difficulty for the coupling, producing an inexpensive coupling device.

Figure 2A:
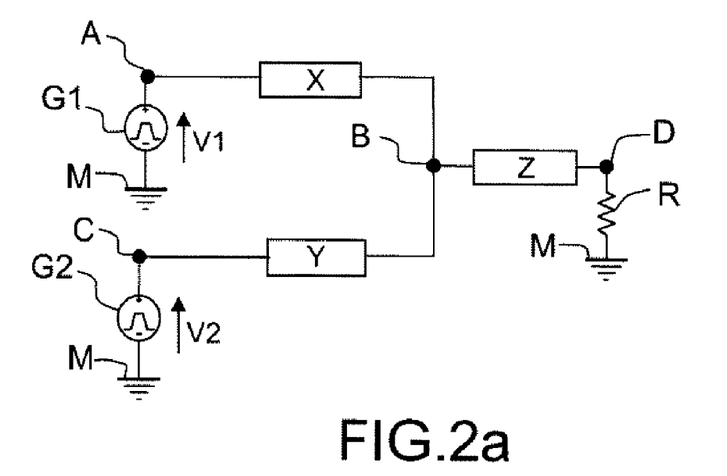
FIG. 2a shows a block diagram of a two-channel coupler according to the invention.
Figure 2B:
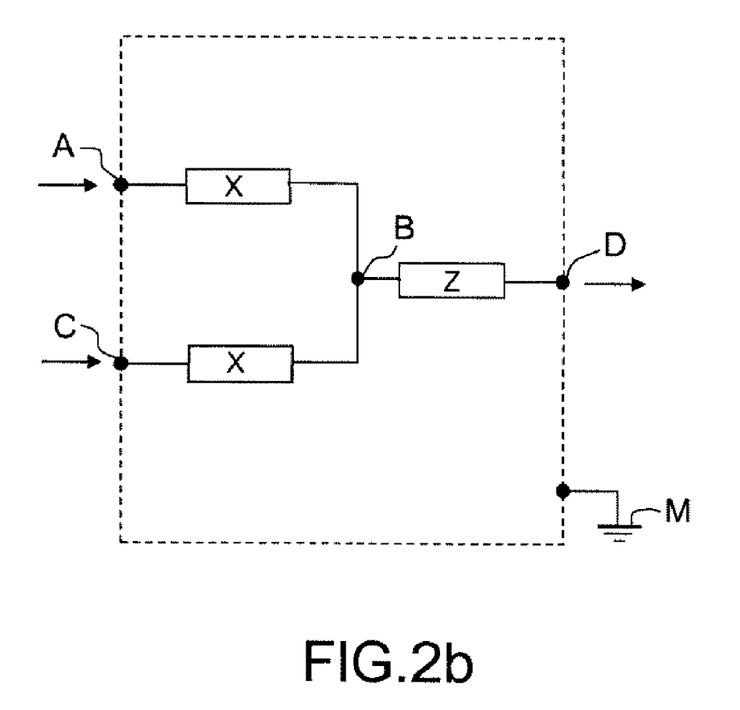
FIG. 2b represents the coupler of FIG. 2a in quadrupole form.

FIG. 2a shows a block diagram of a two-channel coupler according to the invention. FIG. 2b also represents the coupler of FIG. 2a in quadrupole form.

The coupler of FIG. 2a includes an input A of a first channel, an input C of the second channel and an output D of the coupler. The input A of the coupler is intended to receive a first voltage V1 generator G1, the input C a second voltage V2 generator G2 and the output D a load R.

An impedance X is connected by one of its ends to the input A of the first channel, an impedance Y is connected by one of its ends to the input C of the second channel and an output impedance Z is connected between a connection point B between the two free ends of the impedances X and Y and the output D of the coupler.

The following conditions in the coupler of FIG. 2a must be observed:

a very high impedance between the inputs A and C in order to create at least a −20 dB isolation between the voltage generators G1, G2 connected to the inputs A and C of the coupler, an impedance seen by the first generator G1 connected to the input A of the first channel equal to the load R, an impedance seen by the second generator G2 applied to the input C of the second channel equal to the load R, in order to aggregate the voltages V1, V2 of the two generators G1 and G2 in the best conditions, the output voltage of the impedances X and Y connected to the connection point B must be sinusoidal, furthermore, for an aggregation of the voltages V1, V2 of the generators G1, G2, the quadrupole represented in FIG. 2b will have to be symmetrical and reciprocal, which means that the impedance X of the first channel must be equal to the impedance Y of the second channel.

The resultant structure that satisfies these conditions is represented in FIG. 2b. The two impedances connected to the two inputs A and C are identical, for example equal to an impedance X.

Figure 2C:
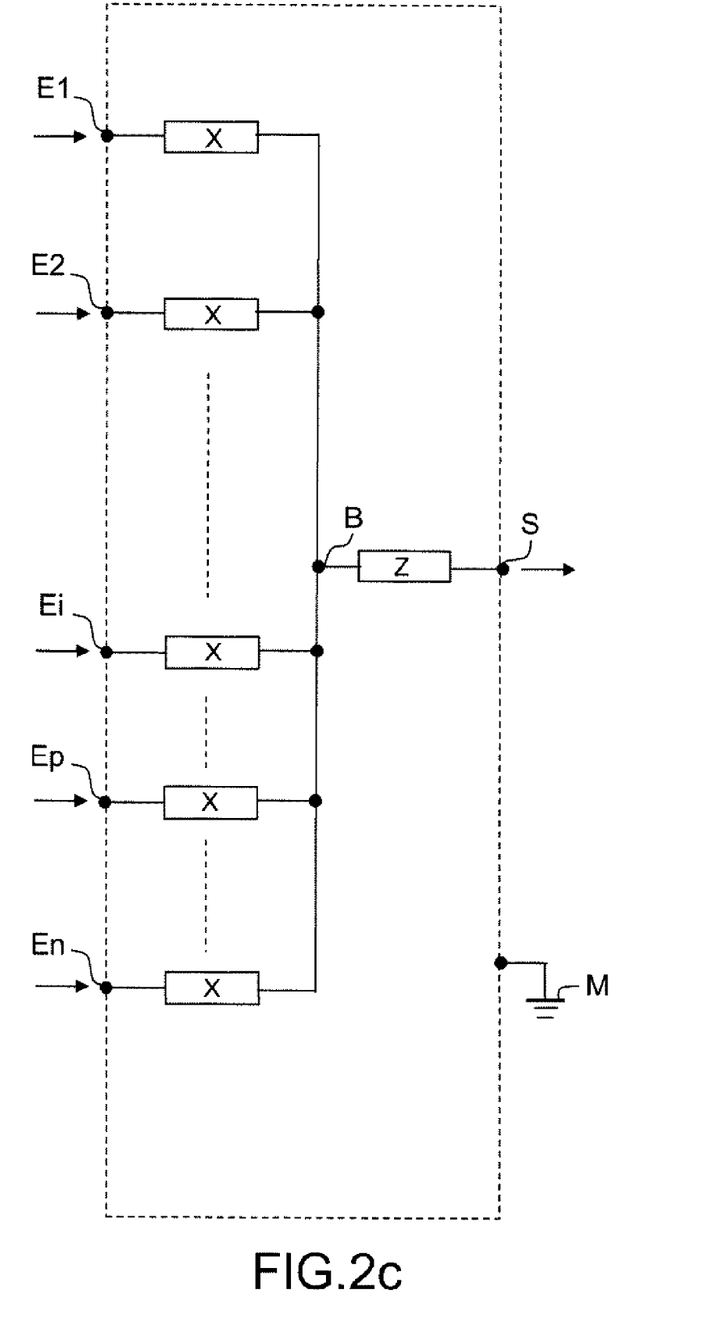
FIG. 2c represents a structure of the n-channel coupler according to the invention represented in quadrupole form.

FIG. 2c represents a structure of the n-channel coupler according to the invention represented in quadrupole form that satisfies said conditions. The structure of FIG. 2c includes n inputs E1, E2, . . . Ei, . . . Ep, . . . En and an output S, n being an integer greater than 1, i and p being two integers between 1 and n, p being different from i.

The coupler of FIG. 2c includes n impedances X, one of the ends of which is connected to a respective input Ei of the coupler, the other free ends of the impedances X being connected to the connection point B, the output impedance Z is connected between the connection point B and the output S of the coupler.

The aim is to find, for such a configuration represented in FIG. 2c, an impedance X that creates a high impedance between any two inputs Ei, Ep of the coupler in order to create strong isolation between said inputs. An inductive element is used to ensure this isolation condition.

Figure 3A:
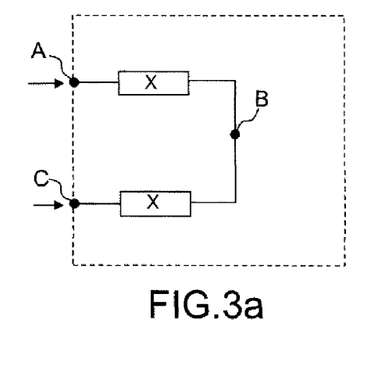
FIG. 3a shows a first portion of the two-input quadrupole of FIG. 2b.

FIG. 3a shows a first portion of the two-input quadrupole of FIG. 2b including two impedances X connected by one of their ends respectively to one A and the other C input and by their free ends to the connection point B.

Figure 3B:
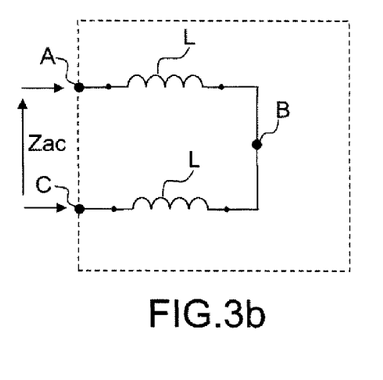
FIG. 3b shows the quadrupole of FIG. 3a including inductors.

FIG. 3b shows the quadrupole of FIG. 3a including inductors. The impedances X of the quadrupole of FIG. 3a are inductors of value L in order to meet the condition for isolation between the two inputs A and C of the quadrupole. The impedance Zac between the two inputs A and C is then expressed by:

$$Zac = (L+L) \cdot 2 \cdot \pi \cdot f$$

f being the operating frequency of the generators G1, G2 applied to the inputs A and B of the quadrupole.

However, as has been stated previously, other criteria must also be addressed by the coupler according to the invention:

the impedance seen any one of the inputs of the quadrupole Ei (see FIG. 2c) must be equal to the load R, the impedance of the circuit between the relevant input Ei of the coupler and the output S (or point D) of the coupler will have to be a short-circuit (or of very low impedance value) so as to limit the transmission losses between the relevant input Ei and the output S of the coupler, the voltage at the connection point B between the impedance X connected to the relevant input Ei and the impedance Z connected to the output S of the coupler must be sinusoidal.

A series resonant circuit of LC type can produce these conditions. The output impedance Z will consequently be a capacitor of value C forming, with the inductor of value L connected to the relevant input Ei, a series resonant circuit at the operating frequency f of the generators.

Figure 4A:
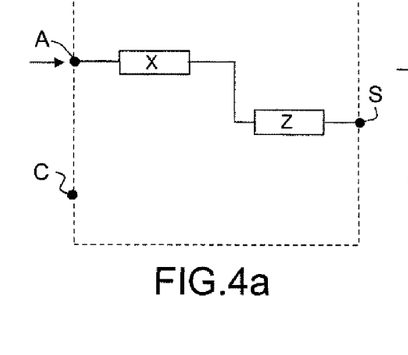
FIG. 4a shows another portion of the quadrupole of FIG. 2b.

To illustrate these considerations:

FIG. 4a shows another portion of the quadripole of FIG. 2b with the impedance X connected to one of the inputs A and the series output impedance Z connected to the output S.

Figure 4B:
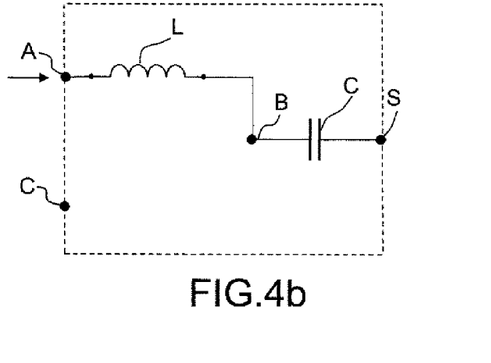
FIG. 4b shows the quadrupole of FIG. 4a including an inductor of value L in series with a capacitor of value C.

FIG. 4b shows the quadrupole of FIG. 4a including an inductor of value L in series with a capacitor of value C forming a series LC resonant circuit between the input A and the output S of the quadrupole.

Figure 4C:
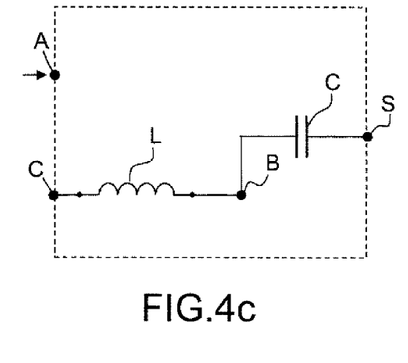
FIG. 4c shows the quadrupole of FIG. 4a including an inductor of value L in series with the capacitor of value C.

FIG. 4c shows the quadrupole of FIG. 4a including an inductor of value L in series with the capacitor of value C forming another series LC resonant circuit between the other input C and the output S of the quadrupole.

By applying the superposition theorem, the structure of the coupler with two inputs A and C can be established.

Figure 5:
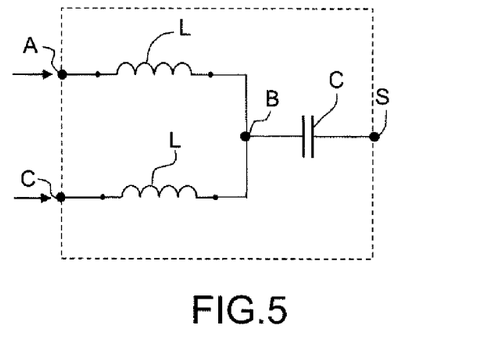
FIG. 5 shows a coupler according to the invention resulting from said superposition of the coupler portions of FIGS. 4b and 4c.

FIG. 5 shows a coupler according to the invention resulting from said superposition of the coupler portion of FIGS. 4b and 4c including two inductors and an output capacitor of value C. Each inductor is respectively connected by one of its ends to each of the two inputs A and C of the coupler and by their other end to the connection point B and to one of the ends of the output capacitor of value C connected by its other end to the output S of the coupler.

Figure 6:
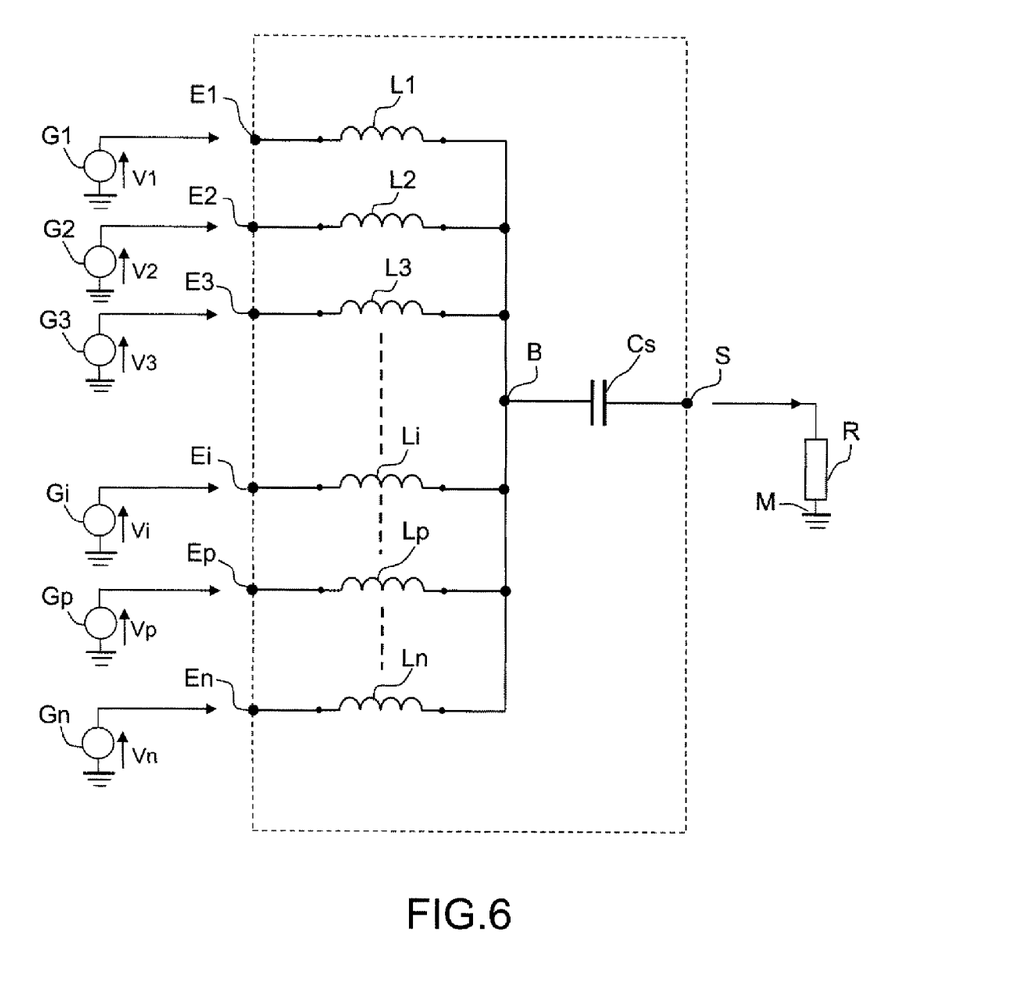
FIG. 6 shows an n-input coupler according to the invention.

FIG. 6 shows an n-input coupler according to the invention that satisfies the conditions explained above.

The coupler of FIG. 6 includes n inputs E1, E2, ... Ei, ... Ep ... En, n being an integer greater than 1, i and p being two integers between 1 and n, p being different from i, and a power output S supplied by all the generators, to within the losses of the coupler.

Each of the inputs of the coupler is intended to be connected to a respective voltage generator G1, G2, ... Gi, ... Gp, ... Gn, supplying respective voltages V1, V2, ... Vi, ... Vp, ... Vn. The output S of the coupler is intended to be connected to a power load R. In the case of a solid-state IHF emitter, the generators are transistorized individual modules, the load is the resonant circuit including the part to be heated.

The coupler of FIG. 6 with n inputs includes n inductors L1, L2, Li, ... Lp, ... Ln, each of the inductors being connected by one of its ends to a respective input E1, E2, ... Ei, ... Ep, ... En of the coupler and by its other free end to a common point B for connection with one end of an output capacitor Cs connected by its other end to the output S of the coupler.

In a preferred embodiment, the values of the inductors L1, L2, Li, ... Ln are identical, or of value L, the output capacitor Cs is of value C.

Determining the impedances $Z_{Ei,Ep}$ between two inputs Ei and Ep of the coupler:

A) First case of a coupler with two inputs E1, E2 (n=2):

The resonance frequency f, which is also the operating frequency of the generators (or of the individual amplifiers of FIG. 1), seen by one of the two inputs E, E2 of the coupler is:

$$f = \frac{1}{2 \cdot \pi \sqrt{L \cdot \frac{C}{2}}} \quad (1)$$

L being the identical value of the inductors L1, L2, and C the value of the output capacitor Cs.

The modulus of the impedance $Z_{E1,E2}$ between the two inputs E1 and E2 of the coupler will be given by:

$$|Z_{E1,E2}| = (L+L) \cdot 2 \cdot \pi \cdot f = 4 \cdot L \cdot \pi \cdot f$$

B) Second case of a coupler with n inputs E1, E2, ... Ei, ... Ep, ... En: The resonance frequency f, which is also the operating frequency of the generators, seen by one of the inputs Ei of the coupler, is $$f = \frac{1}{2 \cdot \pi \sqrt{L \cdot \frac{C}{n}}}$$

L being the identical value of the inductors L1, L2, Li, ... Lp, ... Ln and C the value of the output capacitor Cs of the coupler.

The modulus of the impedance $Z_{Ei,Ep}$ between the two different inputs Ei and Ep of the coupler will be given by:

$$|Z_{Ei,Ep}| = (L+(L/n-1)) \cdot 2 \cdot \pi \cdot f$$

In practice, the impedance $Z_{Ei,Ep}$ between two inputs of the coupler will be greater by at least a factor $K_n$ than the value of the load R applied to the output S of the coupler. For example, this factor $K_n$ can be equal to 20.

For example, in the case of a coupler with two inputs E1, E2, a load R of value equal to 10 ohms and an operating frequency f=500 kHz $$|Z_{E1,E2}|/R > K_2,$$

$K_2$ being a factor expressing the ratio between the impedance $Z_{E1,E2}$ between the two inputs E1 and E2 of the two-channel coupler and the value R of the load of the coupler, or expressed according to L and f:

$$4 \cdot L \cdot \pi \cdot f / R > K_2$$

the value L of each of the inductors L1, L2 will be greater than a minimum value of L such that $$L > K_2 \cdot R / 4 \cdot L \cdot \pi \cdot f$$

If $K_2 = 20$, this gives the value of L, either $$4 \cdot L \cdot \pi \cdot f / R > 20, \text{ i.e. } L > 5 \cdot R / \pi \cdot f$$

or, by using the numerical values of R and f
the value L of the inductors L1, L2 is
L=31.8 µH
The value C of the output capacitor Cs will then be, calculated from the expression (1):

$$C = \frac{1}{f^2 \cdot 2 \cdot \pi^2 \cdot L}$$

i.e. C=6.38 nF.

Figure 7A:
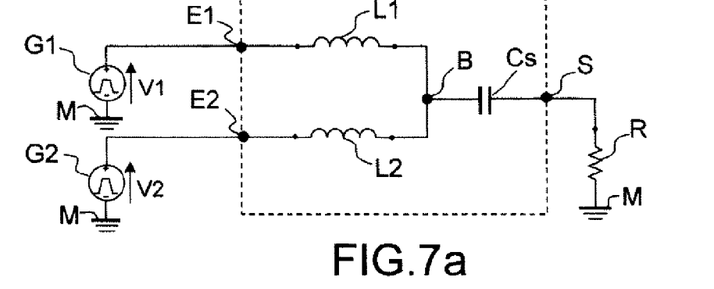
FIG. 7a shows a two-channel coupler according to the invention.

As an example, FIG. 7a shows a two-channel coupler according to the invention including a first input E1, a second input E2 and a coupling output S. The coupler includes two inductors L1 and L2 and an output capacitor Cs.

The values L of the inductors L1 and L2 and the value C of the output capacitor Cs of the coupler of FIG. 7a are determined as described above, according to the operating frequency f of the generators and the value of the load R applied to the output S of the coupler.

The first input E1 of the coupler is driven by a voltage V1 generator G1, the second input E2 is driven by a voltage V2 generator G2.

In a first normal operating configuration, the voltages of the two generators are identical, V1=V2.

Figure 7B:
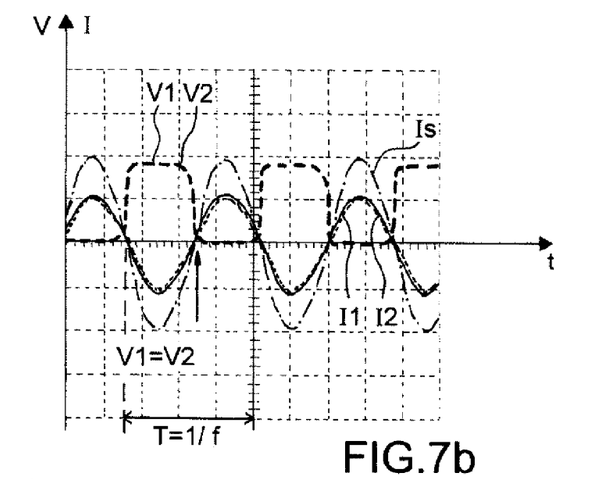
FIG. 7b shows the normal operating configuration of the coupler of FIG. 7a with identical input voltages.

FIG. 7b shows the normal operating configuration of the coupler with identical input voltages. The dotted line curves show the waveform and the amplitude of the voltages V1, V2 and the solid line curves (combined in the figure) show the currents I1, I2 supplied by the two generators.

The voltages V1 and V2 are of rectangular waveform and have a period T=1/f.

The currents I1, I2 supplied by the generator are identical, I1=I2, and the current Is at the output S of the coupler is equal to the sum of the currents I1+I2 supplied by the two generators.

In this first configuration, the current passes through 0 amps when the voltages V1, V2 pass through 0 volts.

Figure 7C:
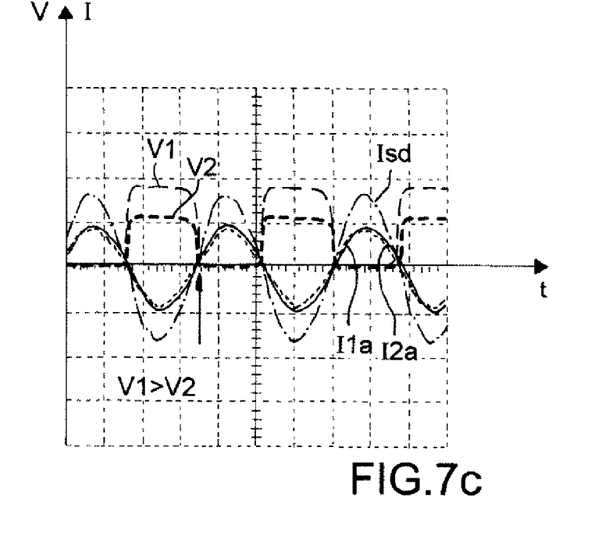
FIG. 7c shows an operating configuration of the coupler with different input voltages.

In a second operating configuration, the voltage V2 of the generator G2 is lower than the voltage V1 of the generator G1, V2<V1 (for example by 40% lower).

FIG. 7c shows an operating configuration of the coupler with different input voltages. The dotted line curves show the waveform and the amplitude of the voltages V1, V2, and the solid line curves show the currents I1a, I2a supplied by the two generators.

The curve V1 (dotted line) shows the voltage of the first generator G1 and the curve V2 (dotted line) that of the second generator G2.

Despite the difference in the voltages, the two generators deliver identical currents I1a=I2a, smaller than the currents I1 and I2 of the first configuration because of a voltage V2 lower than the voltage V1. The current Isa at the output of the coupler is the sum of the two currents I1a+I2a supplied by the generators. Moreover, the tuning of the coupler is unchanged and the currents and voltages pass through a zero value at the same time.

Figure 8A:
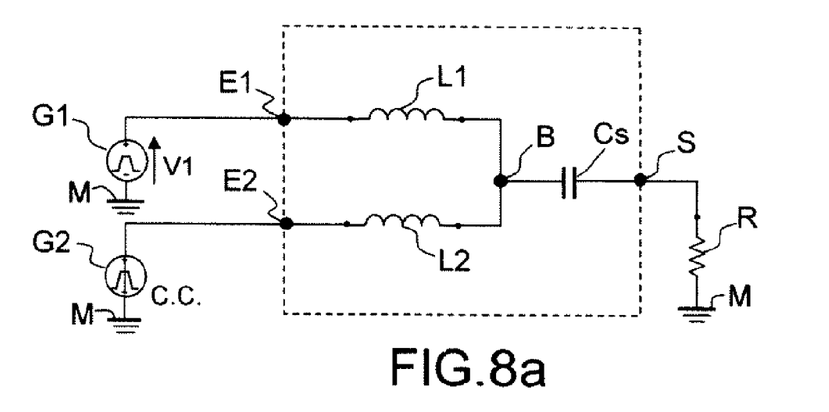
FIG. 8a shows the coupler of FIG. 7a with a short-circuited generator.

In a third operating configuration, the second generator G2 is short-circuited. The voltage V2 is equal to 0 volts and the second input E2 of the coupler is at the reference potential of the second generator G2, or ground M.

FIG. 8a shows the coupler of FIG. 7a with a generator short-circuited.

Figure 8B:
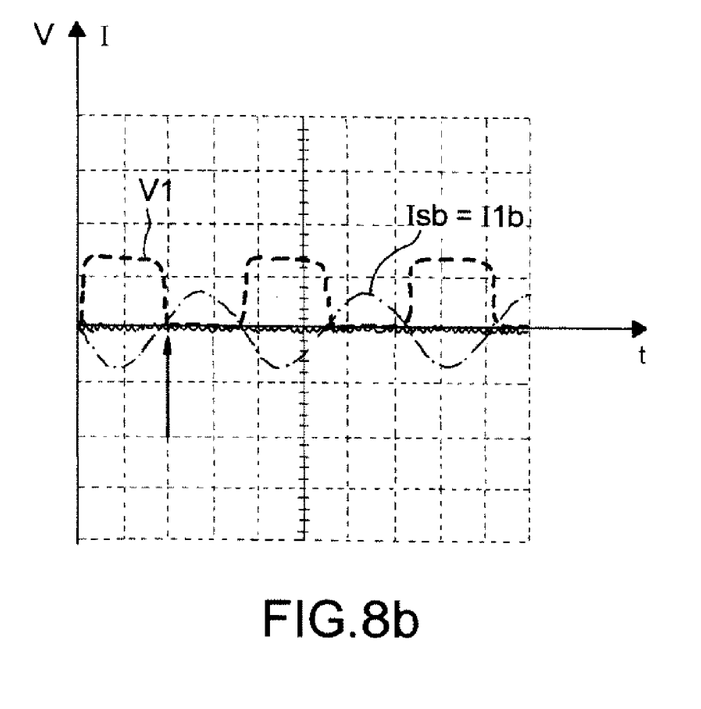

FIG. 8b shows the waveform and the amplitude of the voltages and currents in the coupler of FIG. 8a.

The output of the first generator G1 is, in this third configuration, connected to the ground M by the first inductor L1 and the second inductor L2 in series. The coupler behaves like a transformer with respect to the first generator. According to the principle used to produce this coupler according to the invention, the isolation between the two inputs is high (at least −20 dB). The generator G1 supplies a current I1b in the load R without being disturbed by the short circuit on the second input E2.

The curve V1 shows the rectangular voltage of the first generator and the curve I1b the current. The passing of current I1b through 0 amps always occurs with the passing of V1 through 0 volts.

Figure 9A:
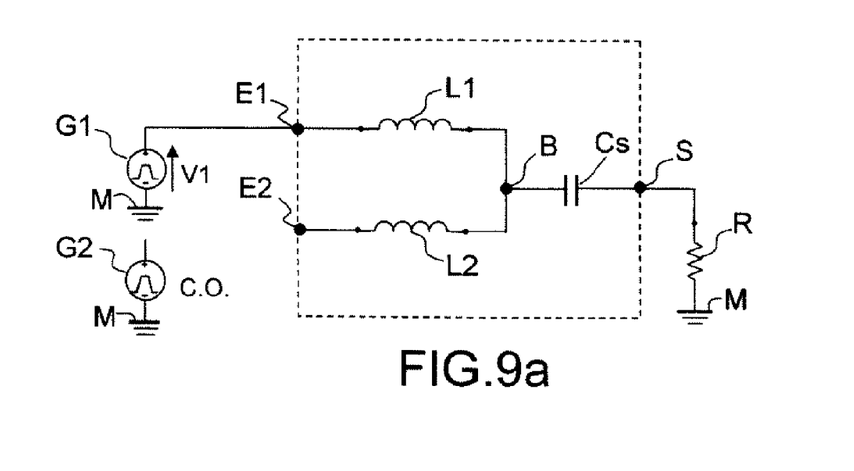
FIG. 9a shows the coupler of FIG. 7a with an open-circuited generator.

In a fourth operating configuration, the second generator G2 is open-circuited. In this fourth configuration, the voltage V2 at the terminals of the second input of the coupler is equal to 0 volts with an impedance relative to the reference potential (for example ground M) of infinity (input E2 unconnected).

FIG. 9a shows the coupler of FIG. 7a with a generator open-circuited.

Figure 9B:
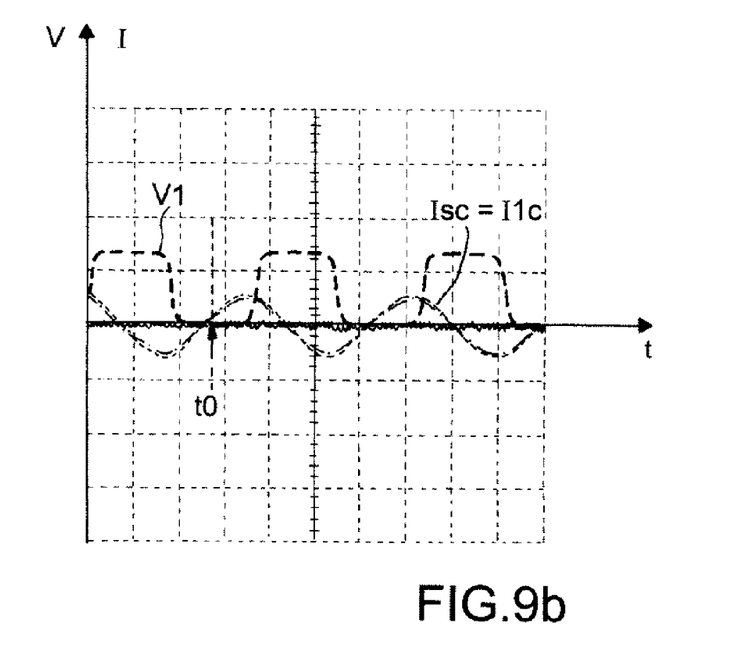

FIG. 9b shows the waveform and the amplitude of the voltages and currents in the coupler of FIG. 9a.

The coupler behaves with respect to the first generator G1 as a simple series inductor/capacitor (LC) cell. The LC circuit is detuned relative to the operating frequency f of the generator, but does not present any danger to the generator equipped with switching transistors. Only a capacitive regime is dangerous for the transistor stages. A current I1c no longer passes through 0 amps for a voltage V1 passing through 0 volts because of the inductive regime produced by the detuning of the circuit (item t0 in FIG. 9b).

We have described a coupler (or coupling device) connected by its output to a resistive impedance load R, but in the case of use, for example, in an IHF emitter, the coupler is intended to power, via its power output S, a resonant circuit, of parallel structure 12, or of series structure 12', (see FIG. 1) including an inductor 14 to heat a part 16. In this usage configuration, the power coupler also serves to adapt the inductor 16 to a resonance frequency which is the operating frequency of the emitter.

Figure 10:
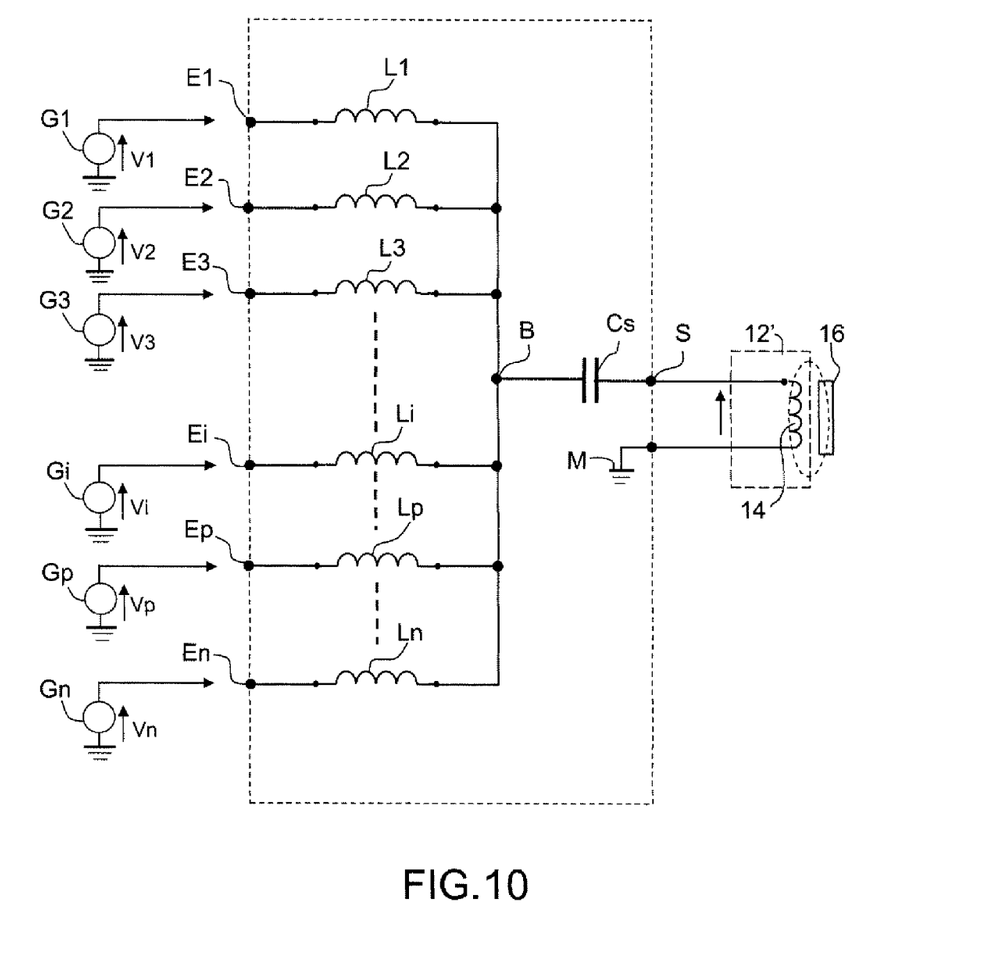
FIG. 10 shows a matching embodiment of the coupler according to the invention, loaded with the inductor of an IHF emitter.

FIG. 10 shows an adaptation embodiment of the coupler, according to the invention, loaded with the inductor 14 of an IHF emitter.

In the application of FIG. 10, the load R is an inductor 14 for heating a part 16. The value Csr of the output capacitor Cs of the coupler is calculated to obtain the tuning with the inductor 14 and the tuning of each of the input channels E1, E2, . . . Ei, . . . Ep . . . En of the coupler to a resonance frequency equal to the operating frequency f of the coupler.

This adaptation embodiment of FIG. 10 has the advantage of reducing the cost of the IHF emitter, the output capacitor Cs of the coupler also being the capacitor tuning the inductor 14 to the resonance frequency f.

The invention also relates to a solid-state industrial high-frequency (IHF) generator as represented in FIG. 1 including a coupler 13 according to the invention.

The load of the heating generator is a resonant circuit 12 electromagnetically coupled to the part to be heated 16 and equivalent either to a parallel R L C circuit, or to a series R L C circuit. The overvoltage quality factor Q of the resonant circuit 12 is high and detuning is easy in the vicinity of the resonance frequency.

The load impedance of the heating generator is essentially variable as it depends on the characteristics of the items forming the resonant circuit and notably the material of the part to be heated, on their dimensions and on their relative position. This position is important primarily if the part to be heated is moving, for example if it is an induction-heated steel plate which is being rolled or is being seam-welded.

The reliability of transistorized modules is associated with the load brought to the transistors of the modules. A so-called reactive impedance producing a high standing wave ratio (SWR) causes the transistors to be destroyed.

In solid-state generators, the reliability approaching 100% for the transistorized modules of the high-frequency power stages, the optimization of the efficiency constitute key and essential criteria for the user.

A solution based on servocontrolling the frequency of the oscillator OSC of the high-frequency generator driving the power stage 10 can be put in place. Servocontrolling the frequency f of the heating generator has the advantage of protecting the transistor and avoiding accidentally switching to a capacitive regime for the transistors.

The invention claimed is:

1. A device for coupling a plurality of individual high-frequency amplifiers (M1, M2, . . . Mn) operating at a frequency f, including n high-frequency inputs E1, E2, . . . Ei, . . . Ep, . . . En, wherein n being an integer greater than 1, i and p being two integers between 1 and n, p being different from i, and a power high-frequency output to supply a load with a power which is a sum of powers supplied by all the plurality of individual high-frequency amplifiers connected via power outputs (sm) of the plurality of individual high-frequency amplifiers to said high-frequency inputs, the device comprising:

n inductors L1, L2, Li, . . . Lp, . . . Ln having first ends connected to a respective high-frequency input E1, E2, . . . Ei, . . . Ep, . . . En, second ends connected together to one end (B) of an output capacitor, wherein the second end is connected to the power high-frequency output in order to form as many series resonant LC circuits, wherein the resonant LC circuit resonates at the frequency f, between the high frequency inputs E1, E2, . . . Ei, . . . Ep, . . . En and the power high-frequency output as the plurality of individual high-frequency amplifiers are coupled; and a coupler having n inputs, wherein the resonance frequency f seen by one of the high-frequency inputs Ei of the coupler is:

$$f = \frac{1}{2 \cdot \pi \sqrt{L \cdot \frac{C}{n}}}$$

L indicates an inductance value as the inductors L1, L2, Li, . . . Lp, . . . Ln and C indicates a capacitance value of the output capacitor of the coupler, wherein the resonance frequency f is same as an operating frequency of the plurality of individual high-frequency amplifiers.

2. The coupling device as claimed in claim 1, wherein, n being equal to 2 inductors L1, L2, the resonance frequency f, seen by one of the two inputs E1, E2 of the coupler is:

$$f = \frac{1}{2 \cdot \pi \sqrt{L \cdot \frac{C}{2}}}$$

L indicates the inductance value of the inductors L1, L2 and C indicates the capacitance value of the output capacitor.

3. The coupling device as claimed in claim 2, wherein modulus of impedance $Z_{E1,E2}$ between the two inputs E1 and E2 of the coupler is given by:

$|Z_{E1,E2}| = (L+L) \cdot 2 \cdot \pi \cdot f = 4 \cdot L \cdot \pi \cdot f.$

4. The coupling device as claimed in claim 3 wherein, in the case of a coupler with two inputs, $|Z_{E1,E2}|/R > K_2,$ $K_2$ indicates a factor expressing a ratio between the impedance $Z_{E1,E2}$ between the two inputs E1 and E2 of the coupler with two channels and the value R of the load of the coupler, or expressed according to L and f:

$4 \cdot L \cdot \pi \cdot f/R > K_2$ the value L of each of the inductors L1, L2 will be greater than a minimum value L such that $L > K_2 \cdot R/4 \cdot L \cdot \pi \cdot f.$ 5. The coupling device as claimed in claim 4, wherein, $K_2$ is equal to 20, the value of L is $4 \cdot L \cdot \pi \cdot f/R > 20,$ i.e. $L > 5 \cdot R/\pi \cdot f.$ 6. The coupling device as claimed in claim 2 wherein the value C of the output capacitor Cs is calculated by:

$$C = \frac{1}{f^2 \cdot 2 \cdot \pi^2 \cdot L}.$$

7. The coupling device as claimed in claim 1, wherein modulus of impedance $Z_{Ei,Ep}$ between the two different inputs Ei and Ep of the coupler will be given by:

$|Z_{Ei,Ep}| = (L + (L/n-1)) \cdot 2 \cdot \pi \cdot f.$

8. The coupling device as claimed in claim 1, wherein impedance ($Z_{Ei,Ep}$) between two inputs $E_i$ and $E_p$ will be greater by at least a factor $K_n$ than the value of a load R applied to the power high-frequency output of the coupler.

9. The coupling device as claimed in claim 8, wherein the factor $K_n$ is equal to 20.

10. The coupling device as claimed in claim 1, wherein, the load R is a heating inductor to heat a part, a value Csr of the output capacitor Cs is calculated to be tuned with the heating inductor and to tune each of channels, of the high-frequency inputs E1, E2, . . . Ei, . . . Ep . . . En, to a resonance frequency equal to the operating frequency f of the coupler.

11. An industrial high-frequency generator (IHF) including a plurality of individual high-frequency solid-state modules (M1, M2, . . . Mn), wherein the plurality of individual high-frequency solid-state modules are coupled by their power outputs sm via a coupling device as claimed in claim 1.

12. The solid-state industrial high-frequency (IHF) generator as claimed in claim 11, further comprising a servo-control for the frequency f of the heating generator.

* * * * *

UNITED STATES PATENT AND TRADEMARK OFFICE
CERTIFICATE OF CORRECTION

PATENT NO. : 8,373,520 B2 Page 1 of 1
APPLICATION NO. : 12/671863
DATED : February 12, 2013
INVENTOR(S) : Bernard Darges It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 328 days.

Signed and Sealed this
First Day of September, 2015

Michelle K. Lee
*Director of the United States Patent and Trademark Office*